(12) United States Patent
Hsu et al.

(10) Patent No.: US 7,839,005 B2
(45) Date of Patent: Nov. 23, 2010

(54) LIGHT EMITTING DIODE WITH SEALANT HAVING FILLING PARTICLES

(75) Inventors: Yu-Ju Hsu, Miao-Li (TW); Jeah-Sheng Wu, Miao-Li (TW); Jia-Shyong Cheng, Miao-Li (TW)

(73) Assignee: Chimei Innolux Corporation, Miao-Li County (TW)

( * ) Notice: Subject to any disclaimer, the term of this patent is extended or adjusted under 35 U.S.C. 154(b) by 137 days.

(21) Appl. No.: 12/290,828

(22) Filed: Nov. 3, 2008

(65) Prior Publication Data

US 2009/0114938 A1    May 7, 2009

(30) Foreign Application Priority Data

Nov. 2, 2007   (TW) .............................. 96141373 A

(51) Int. Cl.
*H01L 23/28* (2006.01)
*H01L 23/29* (2006.01)

(52) U.S. Cl. .............................. 257/795; 257/E23.121; 438/26

(58) Field of Classification Search .................. 438/25, 438/26; 257/795, E23.121
See application file for complete search history.

(56) References Cited

U.S. PATENT DOCUMENTS

| | | | |
|---|---|---|---|
| 6,614,170 B2 * | 9/2003 | Wang et al. ................. 313/498 |
| 6,734,466 B2 * | 5/2004 | Chua ........................... 257/82 |
| 6,881,980 B1 | 4/2005 | Ting |
| 6,922,024 B2 | 7/2005 | Yano et al. |
| 7,102,152 B2 * | 9/2006 | Chua et al. ..................... 257/14 |
| 7,479,733 B2 * | 1/2009 | Chang et al. ................. 313/503 |
| 7,659,548 B2 * | 2/2010 | Wakamatsu et al. ........... 257/98 |
| 2002/0085601 A1 * | 7/2002 | Wang et al. .................... 372/43 |
| 2002/0180351 A1 * | 12/2002 | McNulty et al. ............. 313/512 |
| 2003/0038596 A1 * | 2/2003 | Ho .............................. 313/512 |
| 2006/0214562 A1 * | 9/2006 | Chang et al. ................. 313/503 |
| 2007/0164300 A1 * | 7/2007 | Nabeta et al. ................. 257/98 |
| 2007/0194341 A1 * | 8/2007 | Chang et al. ................... 257/99 |
| 2008/0224096 A1 * | 9/2008 | Chang et al. ............. 252/301.5 |

FOREIGN PATENT DOCUMENTS

WO   WO 2007/017049   *   2/2007

* cited by examiner

*Primary Examiner*—Mary Wilczewski
(74) *Attorney, Agent, or Firm*—Wei Te Chung

(57) ABSTRACT

An exemplary light emitting diode (LED) includes an LED chip and a transparent sealant covering the LED chip. The sealant contains transparent filling particles and phosphor particles, wherein the filling particles are adjacent each other. Intervals are defined between the filling particles, and the phosphor particles are located in the intervals.

20 Claims, 3 Drawing Sheets

LIGHT EMITTING DIODE WITH SEALANT HAVING FILLING PARTICLES

FIELD OF THE INVENTION

Cross-Reference to Related Application

This application is related to, and claims the benefit of, a foreign priority application filed in Taiwan as Ser. No. 096141373 on Nov. 2, 2007. The related application is incorporated herein by reference.

The present disclosure relates to sealed light emitting diodes (LEDs).

GENERAL BACKGROUND

LEDs are well-known solid state devices that can generate light having a peak wavelength in a specific region of the visible spectrum. LEDs are widely used as illuminators, indicators and displays due to their fast response time, high color saturation, and long life.

Referring to FIG. 7, a related art LED 10 includes a substrate 11, an LED chip 12, two conducting wires 13, a first electrode 14, a second electrode 15, a first connecting pin 16, a second connecting pin 17, and a transparent sealant 18.

The substrate 11 includes an upper surface 111 and a lower surface 112. The first electrode 14, the second electrode 15, and the LED chip 12 are symmetrically formed on the upper surface 111 of the substrate 11, wherein the first electrode 14 and the second electrode 15 are respectively located at two opposite sides of the LED chip 12.

One of the two conducting wires 13 interconnects the LED chip 12 and the first electrode 14, and the other conducting wire 13 interconnects the LED chip 12 and the second electrode 15. The first connecting pin 16 passes through the substrate 11. One end of the first connecting pin 16 is connected to the first electrode 14, and the other end of the first connecting pin 16 protrudes out from the lower surface 112 of the substrate 11. The second connecting pin 17 also passes through the substrate 11. One end of the second connecting pin 17 is connected to the second electrode 15, and the other end of the second connecting pin 17 protrudes out from the lower surface 112 of the substrate 11.

The sealant 18 is formed on the upper surface 111 of the substrate 11 and covers the first electrode 14, the second electrode 15, and the LED chip 12. The sealant 18 includes a plurality of phosphor particles 181 therein. The LED chip 12 is a blue LED chip which emits blue light. The phosphor particles 181 may be yttrium aluminum garnet (YAG).

When an operation voltage is provided between the first connecting pin 16 and the second connecting pin 17, the operation voltage across the LED chip 12 makes the LED chip 12 emit blue light. Some of the blue light illuminates the phosphor particles 181 thereby causing the phosphor particles 181 to emit yellow light. The blue light mixed with the yellow light forms white light.

In manufacture of the LED 10, the sealant 18 is initially in a non-solid state prior to being heated and solidified. During this time, the LED 10 may be placed somewhere such as at a workstation for a relatively long time. As a result, the phosphor particles 181 in the sealant 18 are liable to slowly drift down to positions adjacent to the upper surface 111 of the substrate 11 due to the effects of gravity. When this happens, a distribution of the phosphor particles 181 is uneven along vertical directions. In operation of the LED 10, the uneven distribution of the phosphor particles 181 results in uneven transmission of the blue light through the sealant 18, and the chroma of the white light formed by the mixed blue light and yellow light varies with different viewing angles.

It is desired to provide a new LED which can overcome the described limitations.

SUMMARY

An exemplary LED includes an LED chip and a transparent sealant covering the LED chip. The sealant contains a plurality of transparent filling particles and a plurality of phosphor particles. The filling particles are adjacent each other. A plurality of intervals are defined between the filling particles, and the phosphor particles are located in the intervals.

Other novel features and advantages will become more apparent from the following detailed description when taken in conjunction with the accompanying drawings.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Reference will now be made to the drawings to describe various embodiments in detail.

Figure 1:
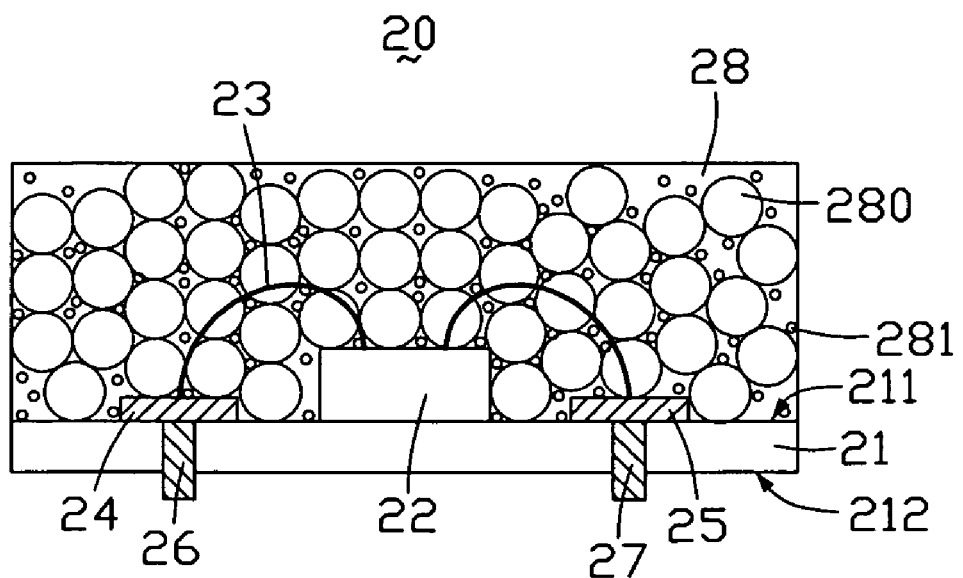
FIG. 1 is a cross-section of an LED of a first embodiment of the present invention.

Referring to FIG. 1, an LED 20 of a first embodiment includes a substrate 21, an LED chip 22, two conducting wires 23, a first electrode 24, a second electrode 25, a first connecting pin 26, a second connecting pin 27, and a transparent sealant 28.

The substrate 21 includes an upper surface 211 and a lower surface 212. The first electrode 24, the second electrode 25, and the LED chip 22 are symmetrically formed on the upper surface 211 of the substrate 21, wherein the first electrode 24 and the second electrode 25 are respectively located at two opposite sides of the LED chip 22. The substrate 21 is typically a square plate.

One of the two conducting wires 23 interconnects the LED chip 22 and the first electrode 24. The other conducting wire 23 interconnects the LED chip 22 and the second electrode 25. The first connecting pin 26 passes through the substrate 21. One end of the first connecting pin 26 is connected to the first electrode 24, and the other end of the first connecting pin 26 protrudes out from the lower surface 212 of the substrate 21. The second connecting pin 27 also passes through the substrate 21. One end of the second connecting pin 27 is connected to the second electrode 25, and the other end of the second connecting pin 27 protrudes out from the lower surface 212 of the substrate 21.

The sealant 28 is formed on the upper surface 211 of the substrate 21 and covers the first electrode 24, the second electrode 25, and the LED chip 22. The sealant 28 includes a plurality of transparent filling particles 280 and a plurality of phosphor particles 281. The filling particles 280 and the phosphor particles 281 are randomly oriented and positioned, but are substantially evenly distributed in the sealant 28. The filling particles 280 occupy a large amount of space within the sealant 28, and adjacent filling particles 280 contact each other. Typically, the filling particles 280 occupy a total amount of space that is larger than a total amount of space occupied by the actual sealant 28 itself. A plurality of spaces (not labeled) are defined between the filling particles 280 for receiving the phosphor particles 281. In other words, the phosphor particles 281 are located in intervals between the filling particles 280. Typically, at least some of the phosphor particles 281 contact adjacent filling particles 280.

The LED chip 22 is a blue LED chip which emits blue light. The phosphor particles 281 may be YAG The filling particles 280 may be hollow transparent balls or solid transparent balls that are made of transparent resin such as polymethyl methacrylate (PMMA). The filling particles 280 may be spherical or elliptical. A diameter of each filling particle 280 is typically 3~15 times that of each phosphor particle 281. A volume of each filling particle 280 is typically 27~3375 times that of each phosphor particle 281.

In summary, the sealant 28 includes the plurality of filling particles 280 therein and the phosphor particles 281 located in the intervals between the filling particles 280. Accordingly, when the sealant 28 is in a non-solid state during manufacture of the LED 20, the phosphor particles 281 in the sealant 28 are held in position and are not liable to drift down due to the effects of gravity. That is, the filling particles 280 partly or even completely block migration of the phosphor particles 281 to other intervals further down in the sealant 28. Thus in the duly manufactured LED 20, a distribution of the phosphor particles 281 is substantially even. The substantially even distribution of the phosphor particles 281 enables the blue light to transmit substantially evenly through the sealant 28, and enables the chroma of white light formed by mixed blue light and yellow light to be uniform.

Moreover, the filling particles 280 function as scattering elements for evenly diffusing the blue light and the yellow light so as to form even, pure white light.

Figure 2:
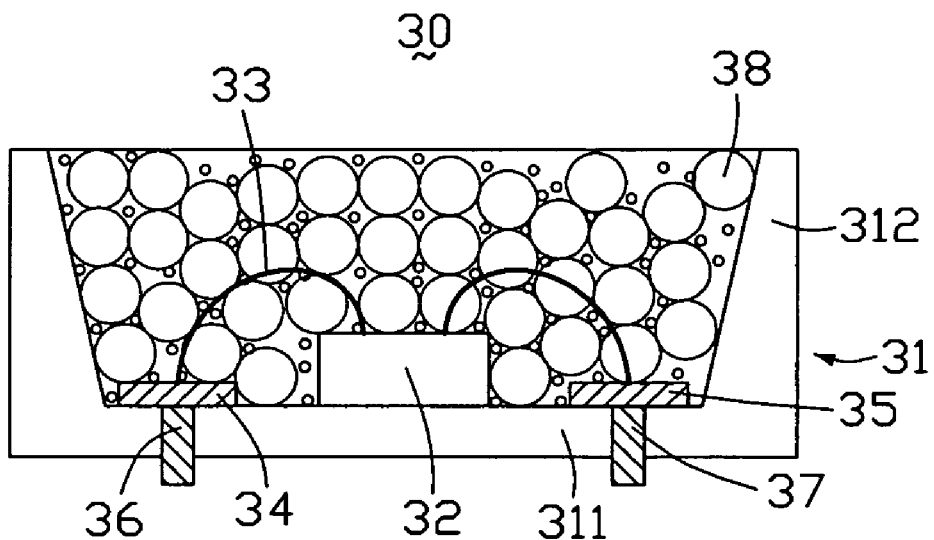
FIG. 2 is a cross-section of an LED of a second embodiment of the present invention.

Referring to FIG. 2, a cross-section of a second embodiment of an LED is shown. The LED 30 is different from the LED 20 of the first embodiment in that the substrate 21 of the LED 20 is replaced by a box 31. A first electrode 34, an LED chip 32, two wires 33, a second electrode 35, and a sealant 38 are received in the box 31. The box 31 includes a bottom plate 311 and a plurality of side walls 31.2 extending from the bottom plate 311. An obtuse angle is formed between each side wall 312 and the bottom plate 311. The first electrode 34, the LED chip 32, and the second electrode 35 are disposed on the bottom plate 311. Two connecting pins 36, 37 pass through the bottom plate 311 to protrude out from the bottom plate 311, and top ends of the connecting pins 36, 37 respectively connect to the first electrode 34 and the second electrode 35. The side walls 312 can reflect light back to a center of the LED 30 according to the obtuse angle between each side wall 312 and the bottom plate 311. Thus a luminance of the LED 30 at the center thereof can be increased.

Figure 3:
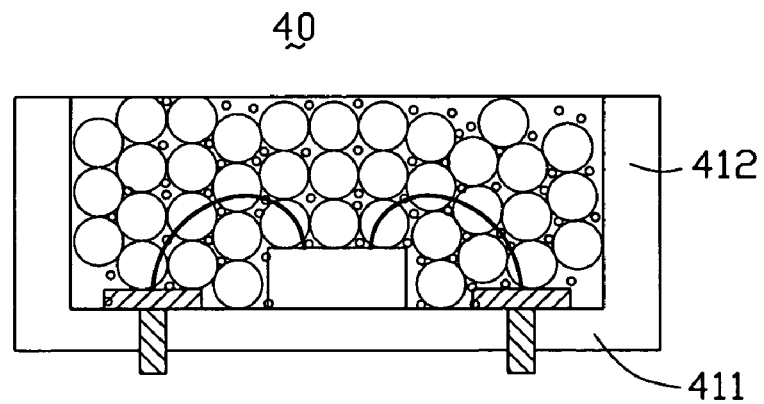
FIG. 3 is a cross-section of an LED of a third embodiment of the present invention.

Referring to FIG. 3, a cross-section of a third embodiment of an LED is shown. The LED 40 is different from the LED 30 of the second embodiment in that a right angle is formed between each of side walls 412 and a bottom plate 411. This can further increase a luminance of the LED 40 at a predetermined viewing angle.

Figure 4:
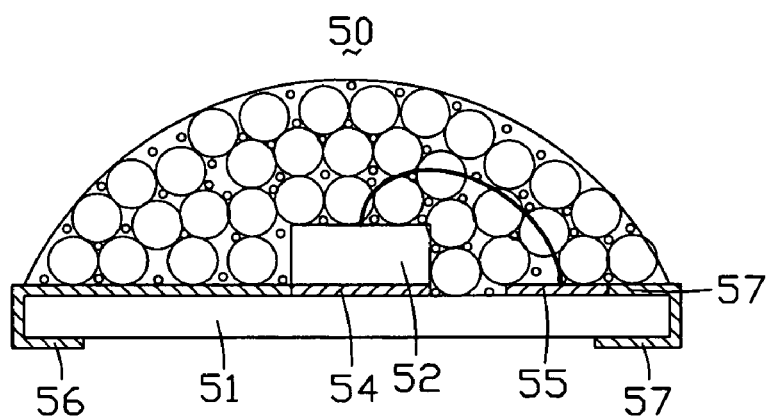
FIG. 4 is a cross-section of an LED of a fourth embodiment of the present invention.

Referring to FIG. 4, a cross-section of a fourth embodiment of an LED is shown. The LED 50 is different from the previously described embodiments in that an LED chip 52 is formed on a first electrode 54, with a bottom surface of the LED chip 52 connected to the first electrode 54 via silver adhesive. First and second connecting pins 56, 57 are formed on surfaces of a substrate 51, and are respectively located at two opposite sides of the substrate 51. Cross-sections of the first and second connecting pins 56, 57 are U-shaped. The first electrode 54 sandwiched between the LED chip 52 and the substrate 51 is connected to the first connecting pin 56. The second electrode 55 formed on the substrate 51 is connected to the second connecting pin 57. The second electrode 55 is connected to a top surface of the LED chip 52 via a connecting wire (not labeled). A sealant (not labeled) is generally partially hemispherical or dome-shaped.

Figure 5:
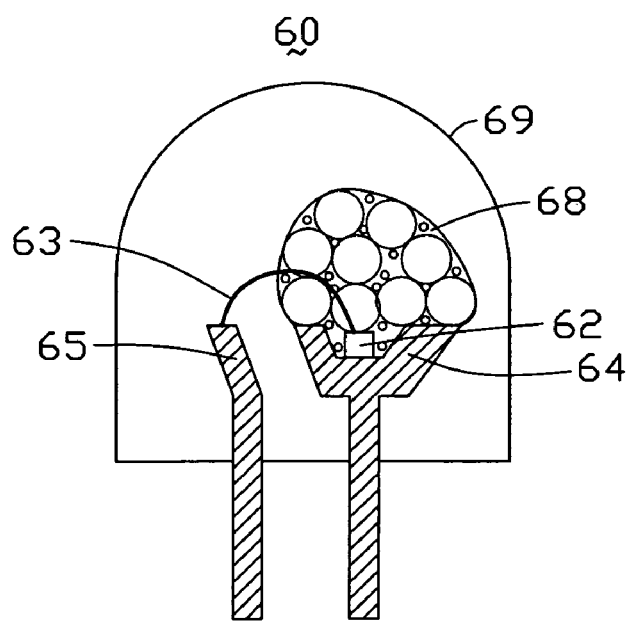
FIG. 5 is a cross-section of an LED of a fifth embodiment of the present invention.

Referring to FIG. 5, a cross-section of a fifth embodiment of an LED is shown. The LED 60 differs from the previously described embodiments in that a first electrode 64 includes a bowl-shaped terminal. An LED chip 62 is located on a bottom surface of the bowl-shaped terminal, thereby connecting to the first electrode 64. The sealant 68 covers the bowl-shaped terminal and the LED chip 62. The LED 60 further includes a transparent shell 69 for receiving part of the first electrode 64, part of a second electrode 65, the LED chip 62, a connecting wire 63, and the sealant 68. A space between the sealant 68 and the shell 69 is typically an air gap.

Figure 6:
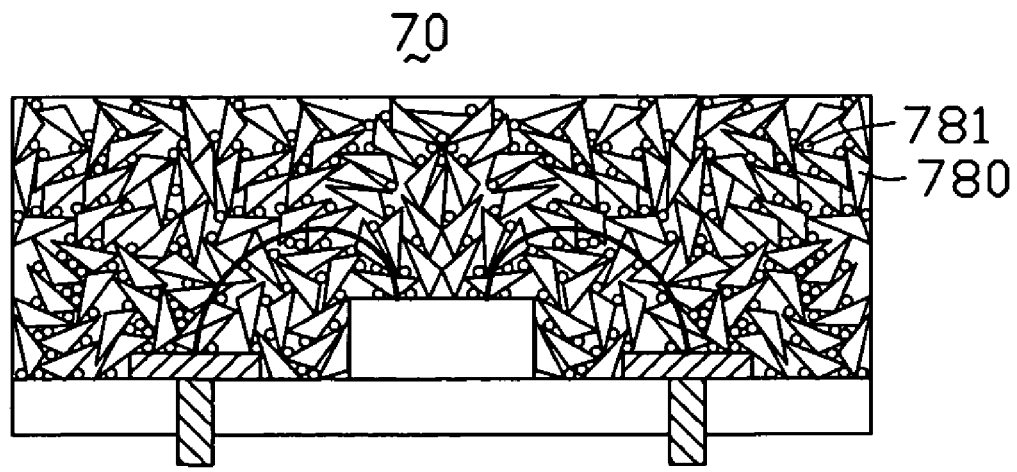
FIG. 6 is a cross-section of an LED of a sixth embodiment of the present invention.
Figure 7:
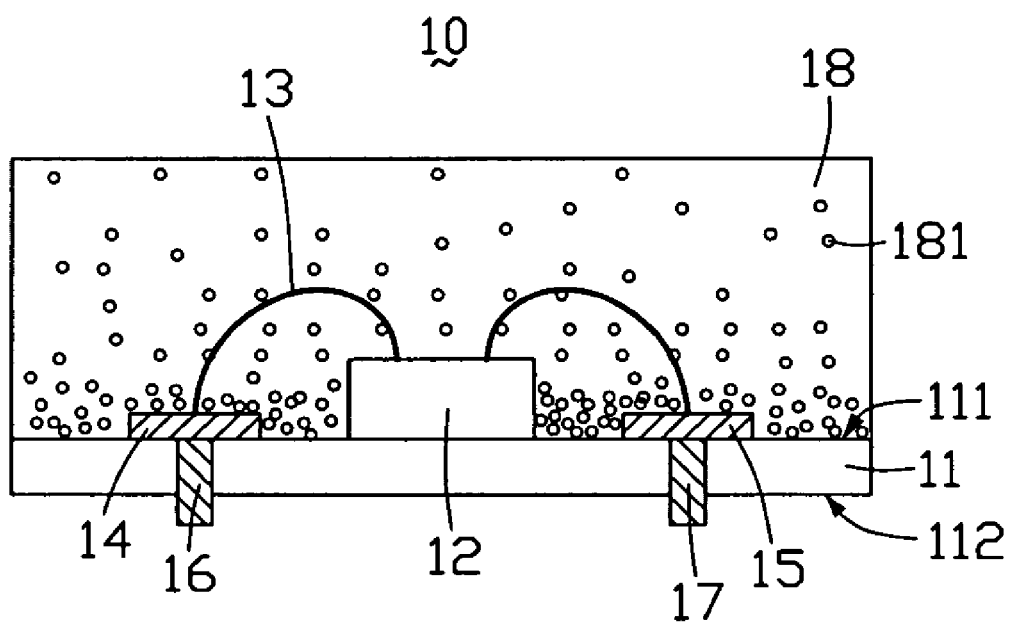
FIG. 7 is a cross-section of a related art LED.

Referring to FIG. 6, a cross-section of a sixth embodiment of an LED is shown. The LED 70 differs from the previously described embodiments in that filling particles 780 are tetrahedrons. The filling particles 780 and phosphor particles 781 are randomly oriented and positioned, but are substantially evenly distributed in a sealant (not labeled). Adjacent filling particles 780 contact each other, and the phosphor particles 781 are located in intervals between the filling particles 780.

In an alternative embodiment, the LED chip 22 is an ultraviolet LED chip and the phosphor particles 281 are red, blue and green phosphor particles. The filling particles 280 may be made of glass. In another alternative embodiment, a reflecting layer is formed on the internal surface of the box 31 to improve light utilization efficiency. In a further alternative embodiment, the filling particles 780 may have shapes selected from the group consisting of cubic, cuboid, cuboidal, and octahedral.

It is to be further understood that even though numerous characteristics and advantages of the present disclosure have been set out in the foregoing description, together with details of the structures and functions of embodiments, the disclosure is illustrative only; and that changes may be made in detail, especially in matters of shape, size and arrangement of parts within the principles of the invention to the full extent indicated by the broad general meaning of the terms in which the appended claims are expressed.

What is claimed is:

1. A light emitting diode (LED) comprising:
   an LED chip and a transparent sealant covering the LED chip, the sealant containing a plurality of transparent filling particles made of polymethyl methacrylate (PMMA) and a plurality of phosphor particles, wherein the filling particles are adjacent each other, a plurality of intervals are defined between the filling particles, and the phosphor particles are located in the intervals.

2. The LED of claim 1, wherein a volume of each filling particle is 27~3375 times that of each phosphor particle.

3. The LED of claim 1, wherein the filling particles and the phosphor particles are randomly oriented and positioned, and are substantially evenly distributed in the sealant.

4. The LED of claim 1, wherein at least a plurality of the phosphor particles contact adjacent filling particles.

5. The LED of claim 1, wherein the filling particles have at least one shape selected from the group consisting of spherical, elliptical, tetrahedral, cubic, cuboid, cuboidal, and octahedral.

6. The LED of claim 1, wherein the filling particles occupy a total amount of space larger than a total amount of space occupied by a material of the sealant.

7. The LED of claim 1, further comprising a first electrode and a second electrode, wherein the first and second electrodes are electrically connected to the LED chip.

8. The LED of claim 7, further comprising a first connecting pin and a second connecting pin respectively connected to the first electrode and the second electrode.

9. The LED of claim 8, further comprising a substrate, wherein the LED chip and the first and second electrodes are formed on the substrate.

10. The LED of claim 9, wherein the first and second electrodes are formed on a surface of the substrate and are respectively located at two opposite sides of the LED chip.

11. The LED of claim 10, wherein the first and second connecting pins pass through the substrate.

12. The LED of claim 10, wherein the first and second connecting pins are formed on surfaces of the substrate and are respectively located at two opposite sides of the substrate.

13. The LED of claim 12, wherein cross-sections of the first and second connecting pins are U-shaped.

14. The LED of claim 7, further comprising a shell receiving part of the first electrode, part of the second electrode, the LED chip, and the sealant.

15. The LED of claim 14, wherein the first electrode includes a bowl-shaped terminal receiving the LED chip therein.

16. The LED of claim 9, further comprising a plurality of side walls extending from the substrate.

17. The LED of claim 15, wherein an obtuse angle or a right angle is formed between each side wall and the substrate.

18. A light emitting diode (LED) comprising:
an LED chip and a transparent sealant covering the LED chip, the sealant containing a plurality of transparent filling particles made of polymethyl methacrylate (PMMA) and a plurality of phosphor particles, wherein the filling particles are arranged adjacent to each other and the phosphor particles are located between the filling particles, and when the sealant is in a non-solid state, the filling particles block gravitational drifting of the phosphor particles to other locations between other of the filling particles.

19. A light emitting diode (LED) comprising:
an LED chip and a transparent sealant covering the LED chip, the sealant defining an accommodating space for receiving a plurality of transparent filling particles and a plurality of phosphor particles; wherein the transparent filling particles occupy a majority amount of the accommodating space within the sealant, the phosphor particles are located between the transparent filling particles, and material of the transparent filling particles comprises polymethyl methacrylate (PMMA).

20. The LED of claim 19, wherein the filling particles and the phosphor particles are randomly oriented and positioned, and are substantially evenly distributed in the sealant.

* * * * *